(12) United States Patent
Tanobe

(10) Patent No.: US 12,272,567 B2
(45) Date of Patent: Apr. 8, 2025

(54) MANUFACTURING METHOD FOR HIGH-FREQUENCY PACKAGE

(71) Applicant: Nippon Telegraph and Telephone Corporation, Tokyo (JP)

(72) Inventor: Hiromasa Tanobe, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 457 days.

(21) Appl. No.: 17/765,475

(22) PCT Filed: Jul. 30, 2020

(86) PCT No.: PCT/JP2020/029206
§ 371 (c)(1),
(2) Date: Mar. 31, 2022

(87) PCT Pub. No.: WO2022/024289
PCT Pub. Date: Feb. 3, 2022

(65) Prior Publication Data
US 2022/0375766 A1   Nov. 24, 2022

(51) Int. Cl.
*H01L 21/48* (2006.01)
*H01L 23/498* (2006.01)
*H01P 11/00* (2006.01)

(52) U.S. Cl.
CPC .... *H01L 21/4853* (2013.01); *H01L 23/49811* (2013.01); *H01P 11/003* (2013.01)

(58) Field of Classification Search
CPC ........... H01L 21/4853; H01L 23/49811; H01L 2223/6638; H01L 23/49555;
(Continued)

(56) References Cited

U.S. PATENT DOCUMENTS

| 4,680,613 A | * | 7/1987 | Daniels | ............... | H01L 23/3135 |
| | | | | | 257/E23.046 |
| 5,484,959 A | * | 1/1996 | Burns | ............... | H01L 23/49541 |
| | | | | | 174/541 |

(Continued)

FOREIGN PATENT DOCUMENTS

| CN | 102169855 A | * | 8/2011 | ......... | G06F 17/5036 |
| CN | 104795379 A | * | 7/2015 | | |

(Continued)

OTHER PUBLICATIONS

Chang Fei Yee, "Key high-speed connector layout techniques", searched Jul. 10, 2020, https://www.edn.com/key-high-speed-connector-layout-techniques/, Sep. 8, 2016, 6 pages.

(Continued)

*Primary Examiner* — Aneeta Yodichkas
*Assistant Examiner* — Jose K Abraham
(74) *Attorney, Agent, or Firm* — Slater Matsil, LLP

(57) ABSTRACT

A method includes adjusting an interval between a linear portion of a first lead and a second lead using a lead shape changing jig. The interval between the linear portion of the first lead and the second lead is adjusted after a distal end portion of a first lead of a first lead frame is connected to a first signal pad and after a distal end portion of a second lead is connected to a second signal pad.

6 Claims, 18 Drawing Sheets

(58) Field of Classification Search
CPC ......... H01L 23/49861; H01L 23/49537; H01L 23/49822; H01L 23/66; H01L 21/50; H01L 23/49541; H01L 23/49838; H01L 2021/60007; H01P 11/003; H01P 3/026; H01P 5/028; G02B 6/4279

See application file for complete search history.

(56) References Cited

U.S. PATENT DOCUMENTS

| | | | | |
|---|---|---|---|---|
| 6,040,621 | A * | 3/2000 | Nose | H01L 23/49541 257/691 |
| 6,061,251 | A * | 5/2000 | Hutchison | H01L 23/66 361/764 |
| 7,541,664 | B2 * | 6/2009 | Lee | H01L 23/4951 257/787 |
| 8,822,273 | B2 * | 9/2014 | Kuo | H01L 24/32 257/676 |
| 9,006,910 | B2 * | 4/2015 | Oikawa | H01L 23/49541 257/786 |
| 9,854,674 | B1 * | 12/2017 | Chen | H05K 1/141 |
| 2006/0049493 | A1 * | 3/2006 | Lee | H01L 23/4951 257/E23.034 |
| 2011/0180942 | A1 * | 7/2011 | Oikawa | H01L 23/66 257/786 |
| 2013/0175078 | A1 * | 7/2013 | Pai | H05K 1/0222 174/264 |
| 2016/0093559 | A1 * | 3/2016 | Xue | H01L 24/38 257/670 |
| 2017/0256507 | A1 * | 9/2017 | Choe | H01P 5/187 |
| 2017/0330824 | A1 * | 11/2017 | Tabata | H04B 5/266 |
| 2019/0148316 | A1 * | 5/2019 | Kubo | H01L 23/13 257/664 |

FOREIGN PATENT DOCUMENTS

| | | | | |
|---|---|---|---|---|
| JP | 2011155176 | A * | 8/2011 | ....... H01L 23/49503 |
| JP | 4934733 | B | 5/2012 | |

OTHER PUBLICATIONS

OIF, Optical Internetowrking Forum, "Implementation Agreement for Integrated Dual Polarization Intradyne Coherent Receivers", IA # OIF-DPC-RX-01.2, IA for Integrated Intradyne Coherent Receivers, Nov. 14, 2013, 25 pages.

* cited by examiner

MANUFACTURING METHOD FOR HIGH-FREQUENCY PACKAGE

CROSS-REFERENCE TO RELATED APPLICATIONS

This application is a national phase entry of PCT Application No. PCT/JP2020/029206, filed on Jul. 30, 2020, which application is hereby incorporated herein by reference.

TECHNICAL FIELD

The present invention relates to a manufacturing method for a high-frequency package including a differential coplanar line.

BACKGROUND

In a device configured to process a high-speed differential signal, including digital coherent optical transmission, a high-frequency signal device package including a differential coplanar line in which two ground lines are arranged across two signal lines adjacent to each other is used. In the differential coplanar line, it is important to make an appropriate high-frequency design for impedance matching and the like between the ground line and the signal line or between the two adjacent signal lines from a printed board to a semiconductor chip.

RELATED ART LITERATURE

Patent Literature

Patent Literature 1: Japanese Patent No. 4934733

Non-Patent Literature

Non-Patent Literature 1: Implementation Agreement for Integrated Dual Polarization Intradyne Coherent Receivers, IA #OIF-DPC-RX-01.2, Nov. 14, 2013.
Non-Patent Literature 2: Chang Fei Yee, "Key high-speed connector layout techniques", [searched Jul. 10, 2020], (https://www.edn.com/key-high-speed-connector-layout-techniques/).

SUMMARY

Problem to be Solved by Embodiments of the Invention

However, standardization bodies such as "Optical Internetworking Forum" have decided the sizes and positions of lead pins to be solder-mounted, which should be satisfied by a high-frequency signal device package holding a semiconductor chip and mounted on a printed board. It is therefore impossible to freely decide the intervals and shapes of lead pins. As described in non-patent literature 1, the shapes of high-frequency lead pins are defined (see FIG. 5), and a change of pitches between signal (+)/(−) leads necessary for improving the high-frequency characteristic is not permitted. As described above, since the degree of freedom of the high-frequency design in high-speed signal transmission is low, it is impossible to appropriately set electromagnetic coupling serving as a differential transmission path between two signal lines.

For example, non-patent literature 1 shows an optical reception module 400 which includes a DC terminal 403 and an output terminal 404 and on which an optical circuit 401 configured to perform optical signal processing for optical signals input from two input ports 402a and 402b is mounted, as shown in FIG. 6. In this technique, details of the structure of a high-frequency lead pin that affects the high-frequency characteristic in the optical reception module including a plurality of high-frequency lead pins are not disclosed. Also, in non-patent literature 2, the three-dimensional shape of lead pins is shown (see FIG. 7). It is assumed that all the pitch intervals between metal pads on a printed board and the intervals between the lead pins are equal from the contact surface. Since the impedance becomes high in portions exposed to air, two signal lead pins are preferably brought as close as possible even from halfway. However, such a structure is not shown in detail and is not mentioned at all.

For this reason, in the high-frequency package, gradually increasing the interval between two signal lead pins connected to two signal lines from the connection ends to the signal lines toward the connection ends to the mounting substrate leads to a satisfactory high-frequency design. However, an efficient package manufacturing method for implementing such a lead pin configuration is not clear.

Embodiments of the present invention has been made to solve the above-described problem, and has as its object to provide an efficient manufacturing method for a high-frequency package, which changes the interval between lead pins.

Means of Solution to the Problem

According to embodiments of the present invention, there is provided a manufacturing method for a high-frequency package, comprising a first step of preparing a package main body including a substrate formed of alternately laminated insulator layers and conductor layers, a first differential coplanar line formed on a surface of the substrate, a second differential coplanar line formed on a back surface of the substrate on a side of a mounting surface of the substrate and connected to the first differential coplanar line, a first signal pad arranged on a side of the back surface of the substrate and connected to a first signal line of the second differential coplanar line, a second signal pad arranged on the side of the back surface of the substrate and connected to a second signal line of the second differential coplanar line, and two ground pads arranged on the side of the back surface of the substrate and connected to two ground lines of the second differential coplanar line, a second step of preparing a first lead frame including a plate-shaped first frame, a first lead, and a second lead, each of the first lead and the second lead including a linear portion extending on a plane including a plane of the first frame, a bent portion bent in a direction for separating from the plane including the plane of the first frame, and a distal end portion at a tip of the bent portion, in which an interval between the distal end portion of the first lead and the distal end portion of the second lead is an interval between the first signal pad and the second signal pad, a third step of preparing a second lead frame including a second frame and two third leads, each of the two third leads including a linear portion extending on a plane including a plane of the second frame, a bent portion bent in a direction for separating from the plane including the plane of the second frame, and a distal end portion at a tip of the bent portion, in which an interval between the distal end portions of the two third leads is an interval between the two ground pads, a fourth step of connecting the distal end portion of the first lead of the first lead frame to the first signal pad, connecting the distal end portion of the second lead to the second signal pad, and connecting the distal end portion of the third lead of the second lead frame to the ground pad, a fifth step of, after the fourth step, separating the first frame from the first lead and the second lead, and separating the second frame from the third leads, a sixth step of, after the fifth step, adjusting an interval between the linear portion of the first lead and the linear portion of the second lead, and a seventh step of, after the sixth step, aligning lengths of the first lead, the second lead, and the third leads.

Effect of Embodiments of the Invention

As described above, according to embodiments of the present invention, after the distal end portion of the first lead of the first lead frame is connected to the first signal pad, and the distal end portion of the second lead is connected to the second signal pad, the interval between the linear portion of the first lead and the linear portion of the second lead is adjusted. It is therefore possible to provide an efficient manufacturing method for a high-frequency package, which changes the interval between lead pins.

DETAILED DESCRIPTION OF ILLUSTRATIVE EMBODIMENTS

A manufacturing method for a high-frequency package according to an embodiment of the present invention will be described below.

First Embodiment

A manufacturing method for a high-frequency package according to the first embodiment of the present invention will be described first with reference to FIGS. 1A to 1P.

Figure 1A:
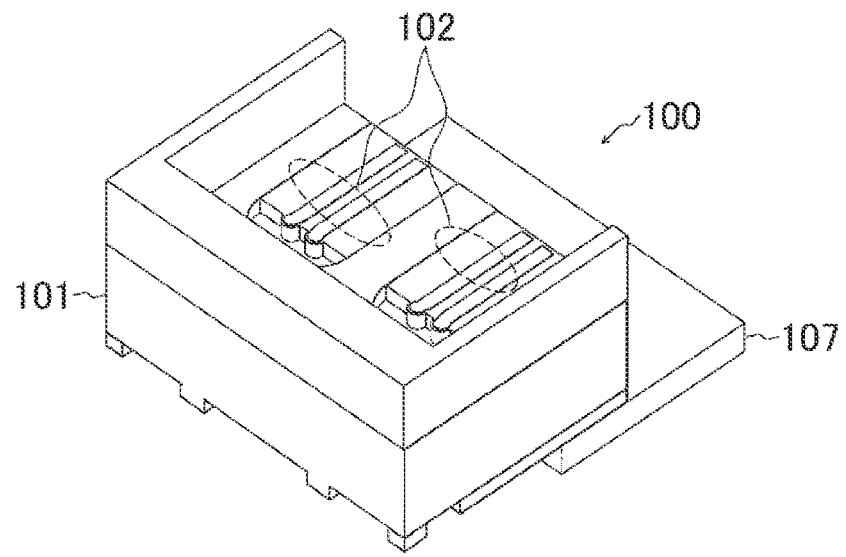
FIG. 1A is a perspective view showing the state of a high-frequency package in a middle step so as to explain a manufacturing method for a high-frequency package according to the first embodiment of the present invention.
Figure 1B:
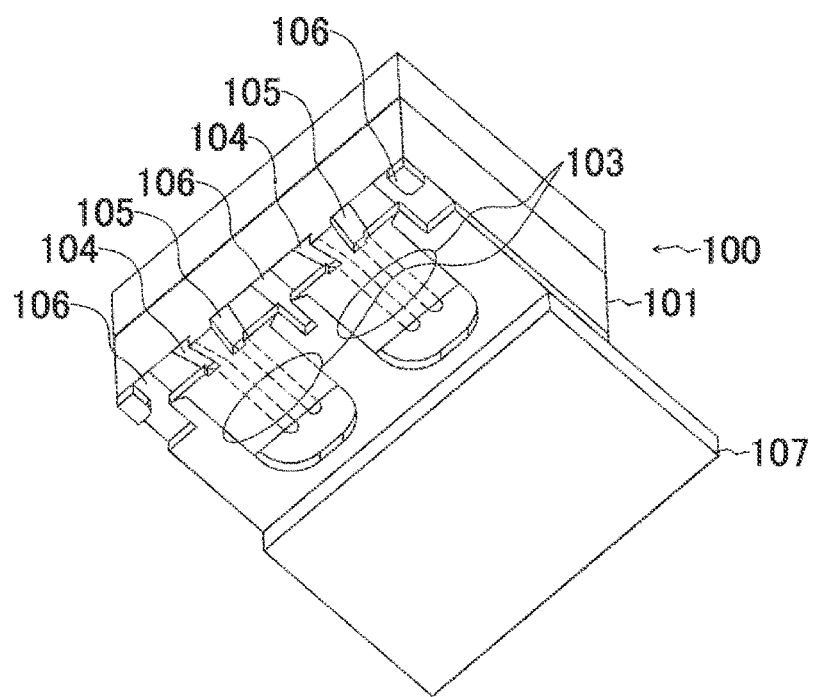
FIG. 1B is a perspective view showing the state of the high-frequency package in a middle step so as to explain the manufacturing method for the high-frequency package according to the first embodiment of the present invention.

First, as shown in FIGS. 1A and 1B, a package main body 100 is prepared (first step). The package main body 100 includes a substrate 101 formed by alternately laminated insulator layers and conductor layers, a first differential coplanar line 102 formed on the surface of the substrate 101, and a second differential coplanar line 103 formed on the back surface on the side of the mounting surface of the substrate 101 and connected to the first differential coplanar line 102. Note that FIG. 1B shows the side of the mounting surface of the package main body 100 (substrate 101). Also, a spacer 107 configured to make the distance constant between a part of the package main body 100 and a mounting board on which these are mounted is provided on the package main body 100 (substrate 101).

Also, the package main body 100 includes a first signal pad 104, a second signal pad 105, and two ground pads 106. The first signal pad 104 is arranged on the side of the back surface (mounting surface) of the substrate 101 and connected to the first signal line of the second differential coplanar line 103. The second signal pad 105 is arranged on the side of the back surface of the substrate 101 and connected to the second signal line of the second differential coplanar line 103. The first signal pad 104 and the second signal pad 105 have an interval that gradually increases from the center side of the package main body 100 toward an end side. The two ground pads 106 are arranged on the side of the back surface of the substrate 101 and connected to the two ground lines of the second differential coplanar line 103.

Figure 1C:
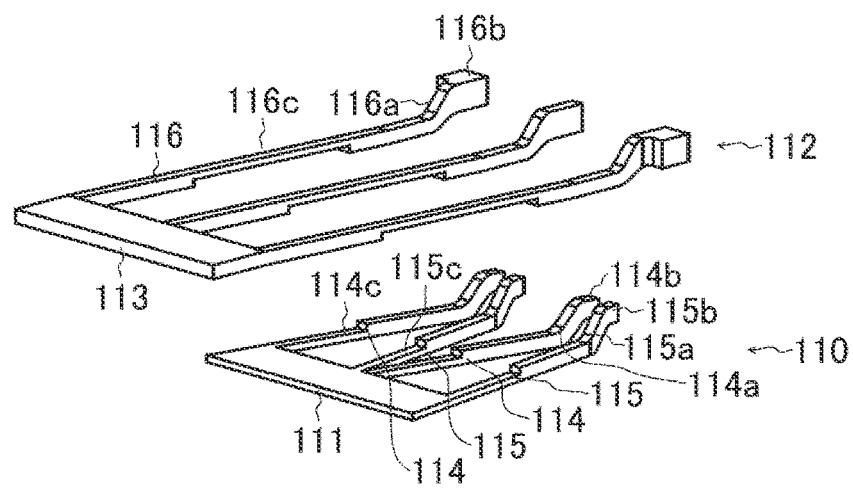
FIG. 1C is a perspective view showing the state of the high-frequency package in a middle step so as to explain the manufacturing method for the high-frequency package according to the first embodiment of the present invention.
Figure 1D:
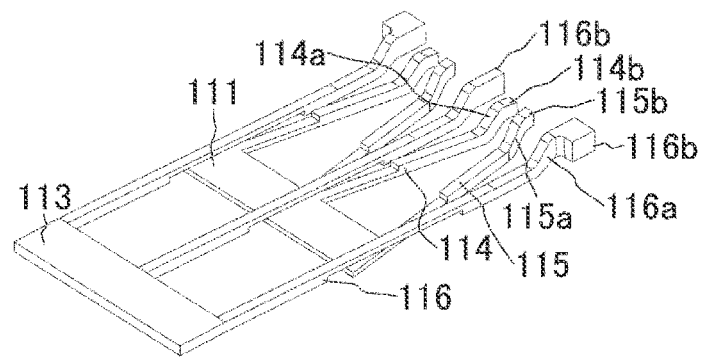
FIG. 1D is a perspective view showing the state of the high-frequency package in a middle step so as to explain the manufacturing method for the high-frequency package according to the first embodiment of the present invention.
Figure 1E:
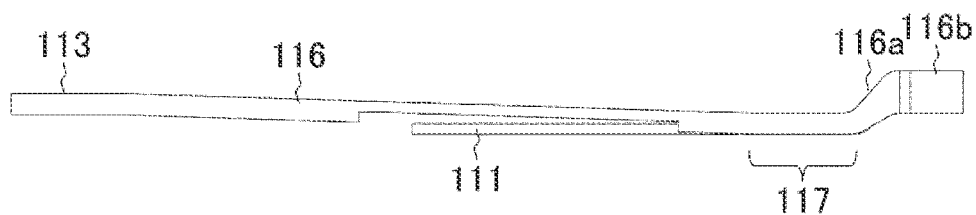
FIG. 1E is a side view showing the state of the high-frequency package in a middle step so as to explain the manufacturing method for the high-frequency package according to the first embodiment of the present invention.

Next, as shown in FIGS. 1C, 1D, and 1E, a first lead frame no is prepared (second step), and a second lead frame 112 is prepared (third step).

The first lead frame no includes a plate-shaped first frame 111, a first lead 114, and a second lead 115. The first lead 114 and the second lead 115 respectively include linear portions extending on a plane including the plane of the first frame 111, bent portions 114a and 115a bent in a direction for separating from the plane including the plane of the first frame 111, and distal end portions 114b and 115b at the tips of the bent portions 114a and 115a. Also, the interval between the distal end portion 114b of the first lead 114 and the distal end portion 115b of the second lead 115 is the interval between the first signal pad 104 and the second signal pad 105. Note that the interval between the first signal pad 104 and the second signal pad 105 is narrower than the interval between the first signal pad 104 and the ground pad 106, which are adjacent to each other, and the interval between the second signal pad 105 and the ground pad 106, which are adjacent to each other.

Additionally, in the first embodiment, the first lead frame no has a shape in which the interval between the first lead 114 and the second lead 115 becomes wider from the side of the distal end portions 114b and 115b to the side of the first frame 111. Also, in the first lead 114 and the second lead 115, thin portions 114c and 115c having a small thickness are provided in the middle of the linear portions to facilitate a cutting work to be performed in post-processing.

The second lead frame 112 includes a second frame 113 and two third leads 116. Each of the two third leads 116 includes a linear portion extending on a plane including the plane of the second frame 113, a bent portion 116a that is bent in a direction for separating from the plane including the plane of the second frame 113, and a distal end portion 116b at the tip of the bent portion 116a. Also, the interval between the distal end portions 116b of the two third leads 116 is the interval between the two ground pads 106. Note that in the first embodiment, the second lead frame 112 has a shape in which the interval between the two third leads 116 is the same interval from the side of the distal end portions 116b to the side of the second frame 113. Also, in each third lead 116, a thin portion 116c having a small thickness is provided in the middle of the linear portion to facilitate a cutting work to be performed in post-processing.

The first lead frame no and the second lead frame 112 are arranged at a predetermined position and overlaid. At this time, in a region 117 of the linear portion of a predetermined length from the bent portion, the positions of the bottom surfaces of the leads are made to match. The region 117 can be used as a reference plane in post-processing.

Figure 1F:
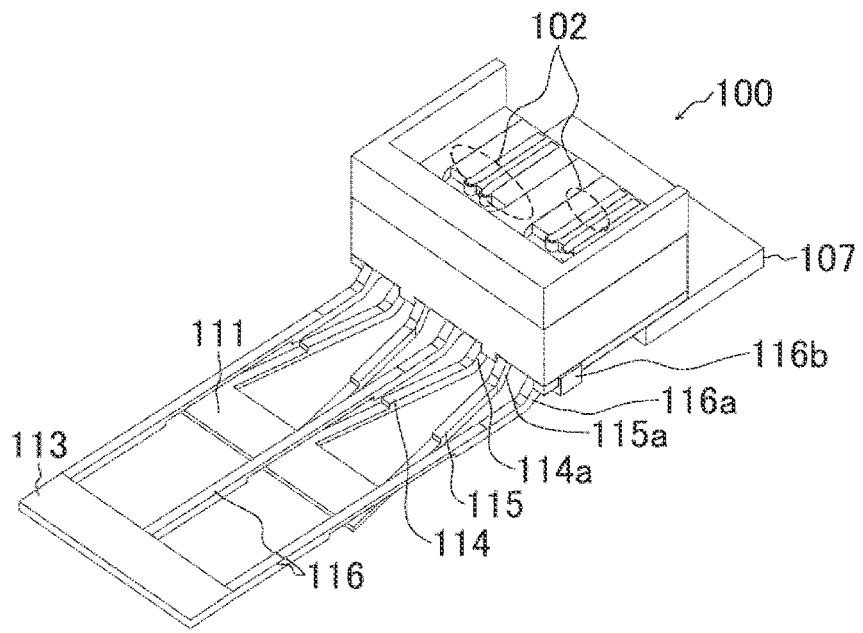
FIG. 1F is a perspective view showing the state of the high-frequency package in a middle step so as to explain the manufacturing method for the high-frequency package according to the first embodiment of the present invention.
Figure 1G:
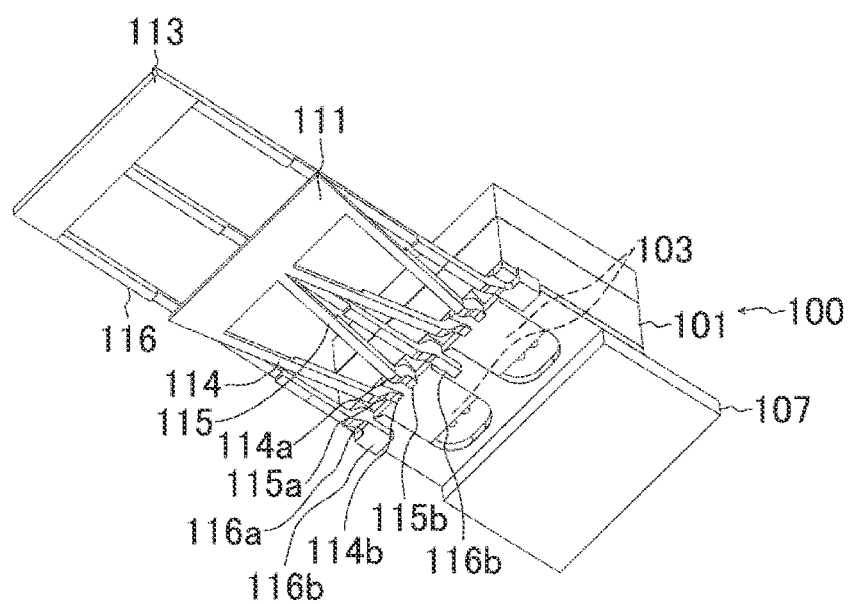
FIG. 1G is a perspective view showing the state of the high-frequency package in a middle step so as to explain the manufacturing method for the high-frequency package according to the first embodiment of the present invention.

Next, as shown in FIGS. 1F and 1G, the distal end portion 114b of the first lead 114 of the first lead frame no is connected to the first signal pad 104, the distal end portion 115*b* of the second lead 115 is connected to the second signal pad 105, and the distal end portion 116*b* of the third lead 116 of the second lead frame 112 is connected to the ground pad 106 (fourth step). For example, the above-described connection can be done by soldering using silver solder or the like. Note that in the first embodiment, the interval gradually decreases from the end portion of the package main body 100 toward the center side. In the same way as in this state, the interval between the first lead 114 and the second lead 115 gradually decreases toward the distal end portions 114*b* and 115*b*.

Figure 1H:
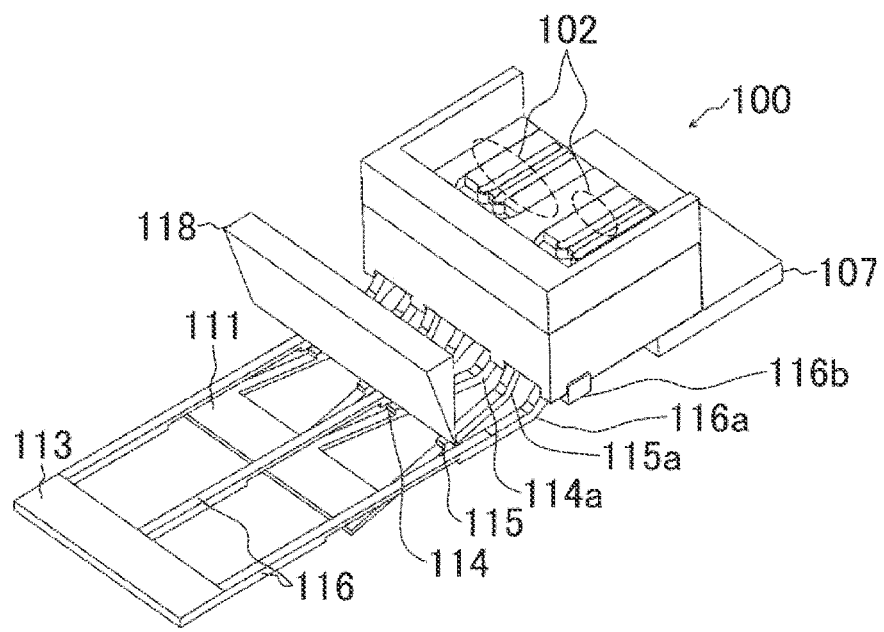
FIG. 1H is a perspective view showing the state of the high-frequency package in a middle step so as to explain the manufacturing method for the high-frequency package according to the first embodiment of the present invention.
Figure 1I:
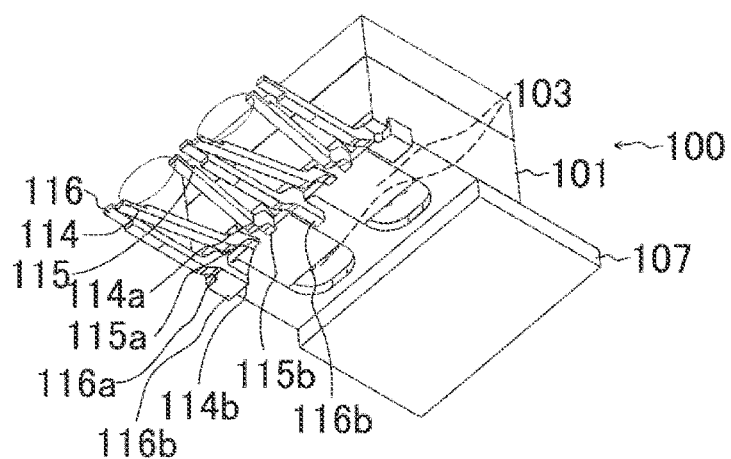
FIG. 1I is a perspective view showing the state of the high-frequency package in a middle step so as to explain the manufacturing method for the high-frequency package according to the first embodiment of the present invention.

After the above-described fourth step, the first frame 111 is separated from the first lead 114 and the second lead 115, and the second frame 113 is separated from the third leads 116 (fifth step). For example, as shown in FIG. 1H, the thin portions with a small thickness in the middle of the linear portions of the leads are cut at once using a cutting blade 118 to make each lead have a predetermined length. After the cutting, as shown in FIG. 1I, the finish shape of the first lead 114 and the second lead 115 and the finish shape of the third leads 116 are different. The interval between the first lead 114 and the second lead 115 gradually changes and decreases from the cut end indicated by a dotted ellipse in FIG. 1I toward the bent portions.

Figure 1J:
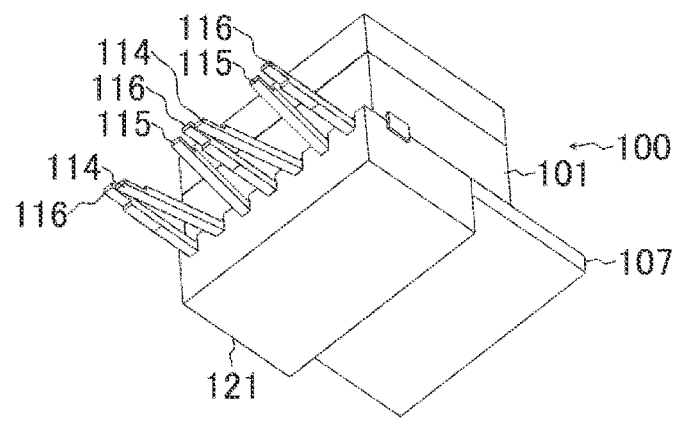
FIG. 1J is a perspective view showing the state of the high-frequency package in a middle step so as to explain the manufacturing method for the high-frequency package according to the first embodiment of the present invention.
Figure 1K:
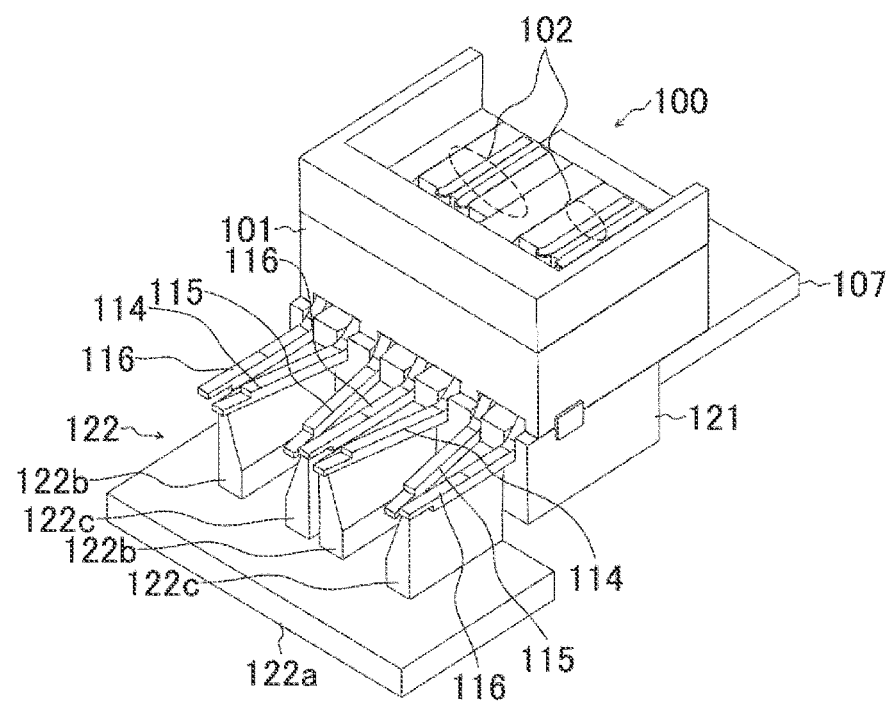
FIG. 1K is a perspective view showing the state of the high-frequency package in a middle step so as to explain the manufacturing method for the high-frequency package according to the first embodiment of the present invention.
Figure 1L:
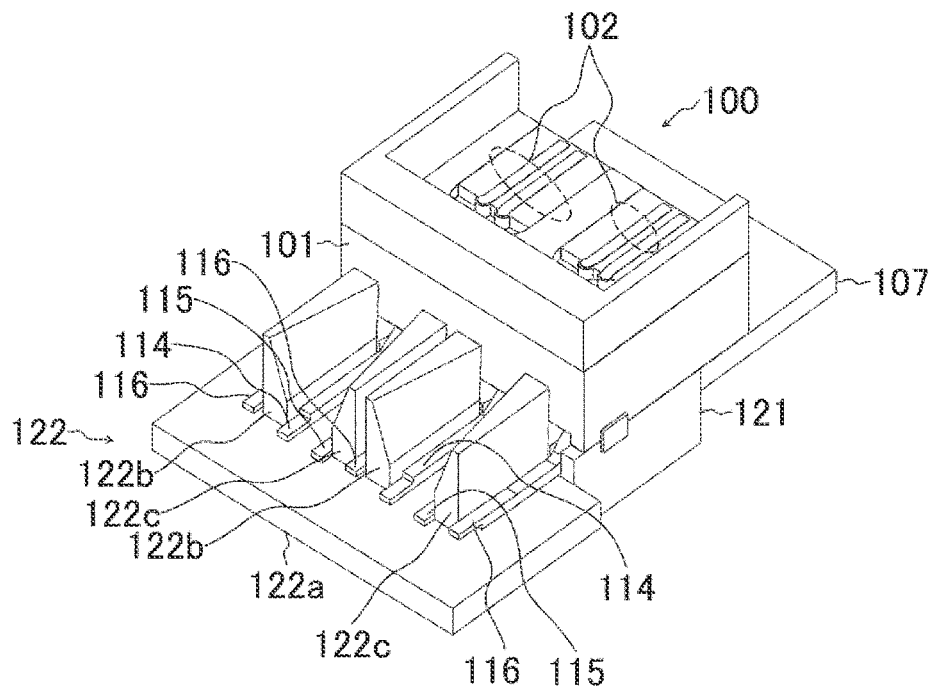
FIG. 1L is a perspective view showing the state of the high-frequency package in a middle step so as to explain the manufacturing method for the high-frequency package according to the first embodiment of the present invention.
Figure 1M:
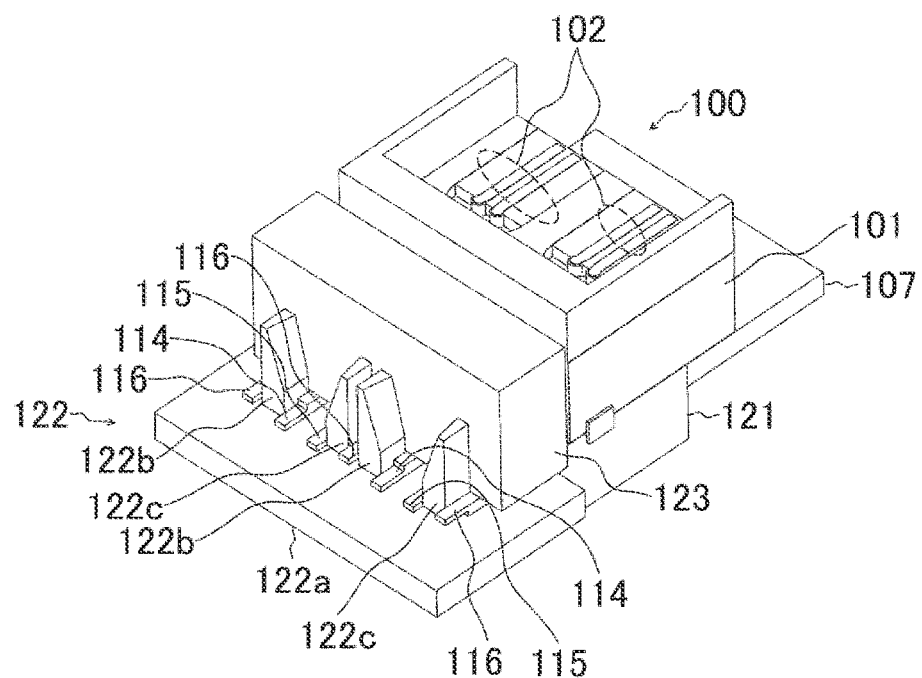
FIG. 1M is a perspective view showing the state of the high-frequency package in a middle step so as to explain the manufacturing method for the high-frequency package according to the first embodiment of the present invention.

Next, after the fifth step, the interval between the linear portion of the first lead 114 and the linear portion of the second lead 115 is adjusted (sixth step). First, as shown in FIG. 1J, a holding jig 121 is fixed to the side of the mounting surface of the package main body 100. Next, as shown in FIGS. 1K, 1L, and 1M, the interval between the linear portion of the first lead 114 and the linear portion of the second lead 115 is adjusted using a lead shape changing jig 122.

The lead shape changing jig 122 includes a base portion 122*a*, and projecting portions 122*b* and 122*c* provided on the base portion 122*a*. Each of the projecting portions 122*b* and 122C has a strip shape extending in the same direction as the leads in a planar view. Also, each of the projecting portions 122*b* and 122*c* has a sectional shape that gradually becomes wider from the upper portion toward the lower portion (the side of the base portion 122*a*). The width of each of the projecting portions 122*b* and 122C gradually increases from the upper portion of the lower portion such that the interval between the projecting portions gradually decreases. In addition, the projecting portions 122*b* and 122*c* have an even interval in a predetermined portion on the side of the base portion 122*a*.

The first lead 114 and the second lead 115 are arranged between the projecting portion 122*b* and the projecting portion 122C, and the package main body 100 with the holding jig 121 fixed on it is slid in the vertical direction to the side of the base portion 122*a* of the lead shape changing jig 122. Accordingly, the first lead 114 and the second lead 115 are deformed along the gradually decreasing interval between the projecting portion 122*b* and the projecting portion 122C, and the interval between the first lead 114 and the second lead 115 gradually changes (decreases).

Figure 1N:
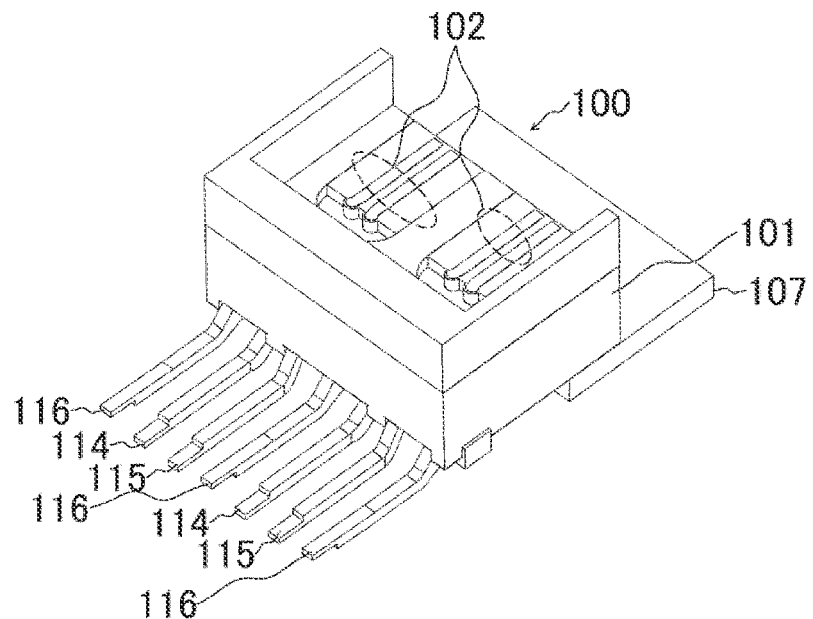
FIG. 1N is a perspective view showing the state of the high-frequency package in a middle step so as to explain the manufacturing method for the high-frequency package according to the first embodiment of the present invention.

When all leads reach the upper surface of the base portion 122*a*, the interval between the linear portion of the first lead 114 and the linear portion of the second lead 115 becomes equal over the whole area (the pitches become even). In addition, when all leads reach the upper surface of the base portion 122*a*, this state is held, and a pressing jig 123 is pressed from above in this state. After that, all jigs are detached. This makes it possible to align the height positions of the first lead 114 and the second lead 115 in the plane direction of the substrate 101, as shown in FIG. 1N.

Figure 1O:
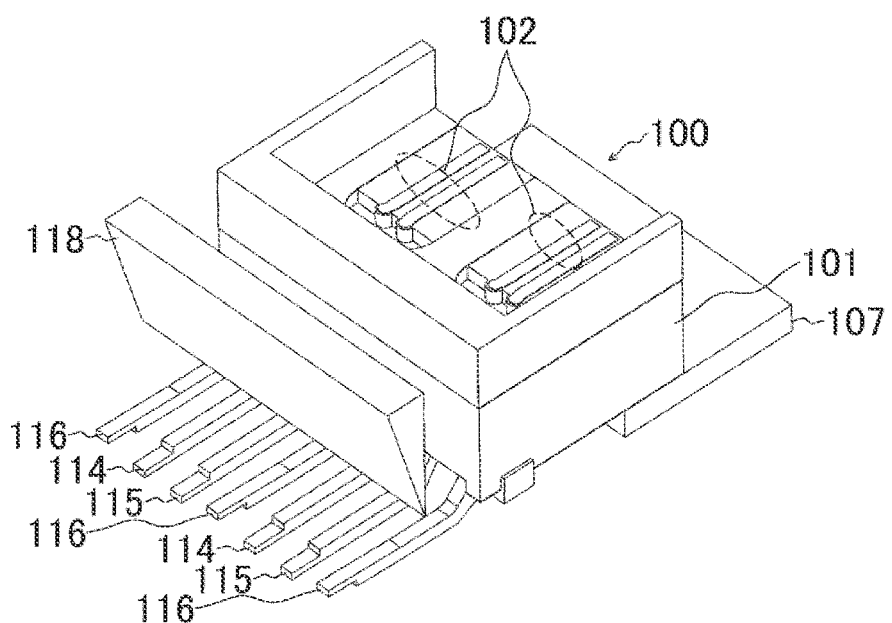
FIG. 1O is a perspective view showing the state of the high-frequency package in a middle step so as to explain the manufacturing method for the high-frequency package according to the first embodiment of the present invention.
Figure 1P:
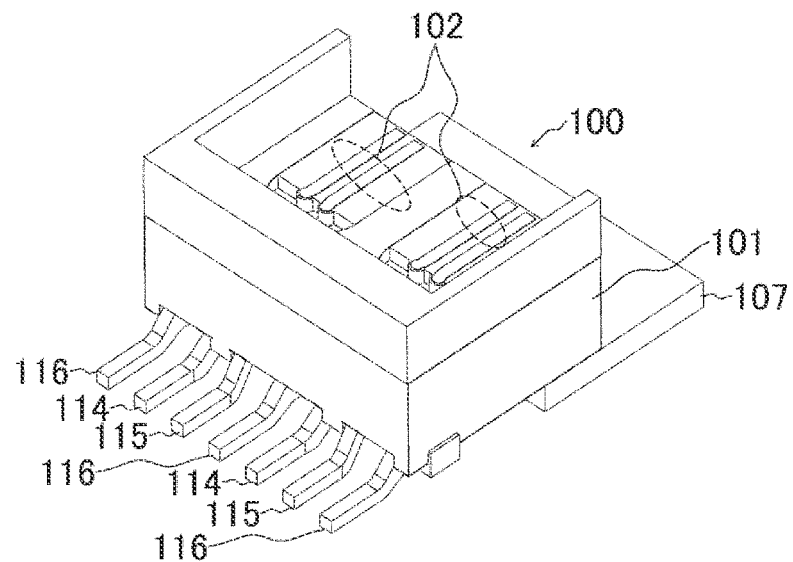
FIG. 1P is a perspective view showing the state of the high-frequency package in a middle step so as to explain the manufacturing method for the high-frequency package according to the first embodiment of the present invention.

Next, the lengths of the first lead 114, the second lead 115, and the third leads 116 are aligned (seventh step). For example, as shown in FIG. 1O, the leads are cut at once using the cutting blade 118, thereby aligning the lengths of the first lead 114, the second lead 115, and the third leads 116, as shown in FIG. 1P.

When completed, a high-frequency package in which the pitches between the third leads 116 serving as ground lead pins and the first lead 114 and the second lead 115 serving as signal lead pins are aligned can be obtained. By the manufacturing method according to the above-described first embodiment, even if the pitches of the differential signal lines in the package main body are narrow, the pitch width of the differential signal lead pins can be made wider than that. This can align the pitches of all lead pins and make contribution to improvement of productivity when mounting the package on a board.

Second Embodiment

A manufacturing method for a high-frequency package according to the second embodiment of the present invention will be described next with reference to FIGS. 2A to 2D.

First, as is the first embodiment, as described with reference to FIGS. 1A and 1B, a package main body 100 is prepared (first step). Next, as described with reference to FIGS. 1C, 1D, and 1E, a first lead frame no is prepared (second step), and a second lead frame 112 is prepared (third step).

Next, as described with reference to FIGS. 1F and 1G, a distal end portion 114*b* of a first lead 114 of the first lead frame no is connected to a first signal pad 104, a distal end portion 115*b* of a second lead 115 is connected to a second signal pad 105, and a distal end portion 116*b* of a third lead 116 of the second lead frame 112 is connected to a ground pad 106 (fourth step).

After the above-described fourth step, the first frame 111 is separated from the first lead 114 and the second lead 115, and the second frame 113 is separated from the third leads 116 by the same method as in the above-described first embodiment (fifth step).

Figure 2A:
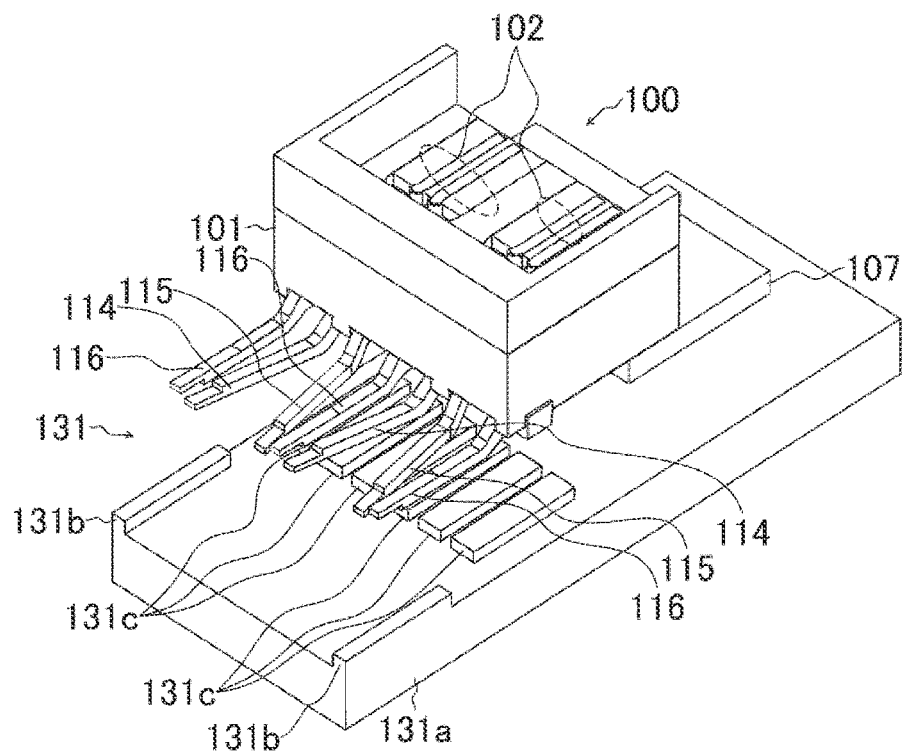
FIG. 2A is a perspective view showing the state of a high-frequency package in a middle step so as to explain a manufacturing method for a high-frequency package according to the second embodiment of the present invention.

Next, after the fifth step, the interval between the linear portion of the first lead 114 and the linear portion of the second lead 115 is adjusted (sixth step). First, as shown in FIG. 2A, a lead shape changing jig 131 is prepared. In the second embodiment, the package main body 100 is slid in a predetermined direction on the surface of the lead shape changing jig 131, thereby adjusting the interval between the linear portion of the first lead 114 and the linear portion of the second lead 115.

The lead shape changing jig 131 includes a base portion 131*a*, guides 131*b* provided at the two ends of the upper surface of the base portion 131*a*, and a plurality of projections 131*c* aligned on the upper surface of the base portion 131*a*. The interval between the two guides 131*b* is the same as the width between the outer sides of the two third leads 116 arranged outside.

Also, each of the plurality of projections 131*c* has a rectangular shape in a planar view, which has long sides in the direction (slide direction) for sliding the package main body 100. The interval between the projections 131*c* adjacent to each other is the same as the width of each lead. In addition, the width of each of the plurality of projections 131*c* in the array direction equals the interval to arrange the bent portions of the leads.

Figure 2B:
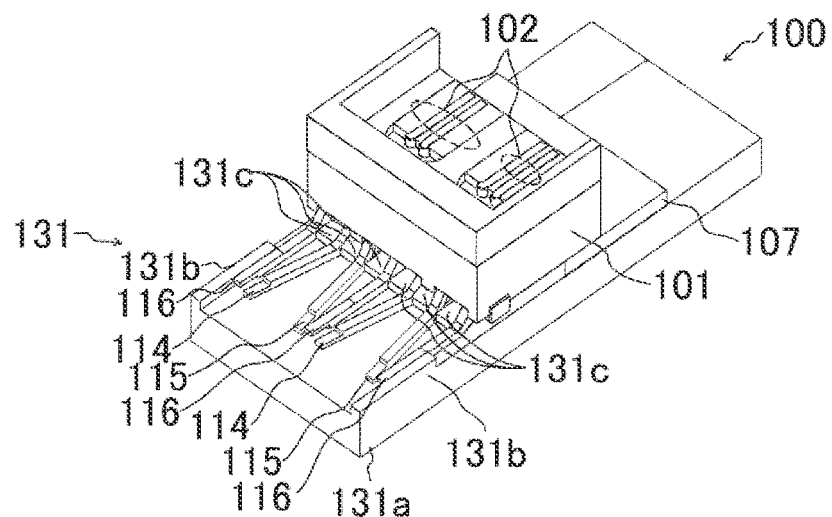
FIG. 2B is a perspective view showing the state of the high-frequency package in a middle step so as to explain the manufacturing method for the high-frequency package according to the second embodiment of the present invention.

First, as shown in FIG. 2B, the package main body 100 is mounted on the upper surface of the base portion 131*a* provided with the plurality of projections 131c. At this time, the array direction of the pads provided on the mounting surface of a substrate 101 is set vertical to the slide direction. In addition, on one end side of the plurality of projections 131c, the bent portions of the leads are fitted between the projections 131c adjacent to each other.

Figure 2C:
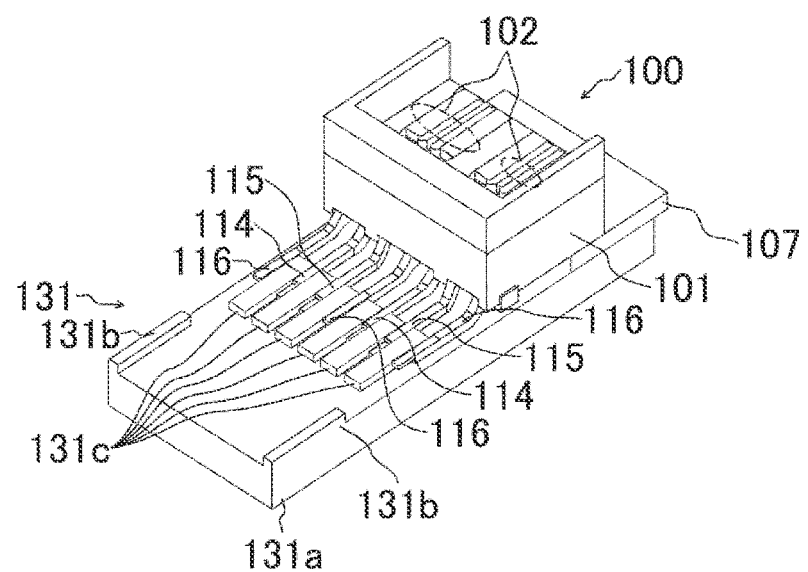
FIG. 2C is a perspective view showing the state of the high-frequency package in a middle step so as to explain the manufacturing method for the high-frequency package according to the second embodiment of the present invention.
Figure 2D:
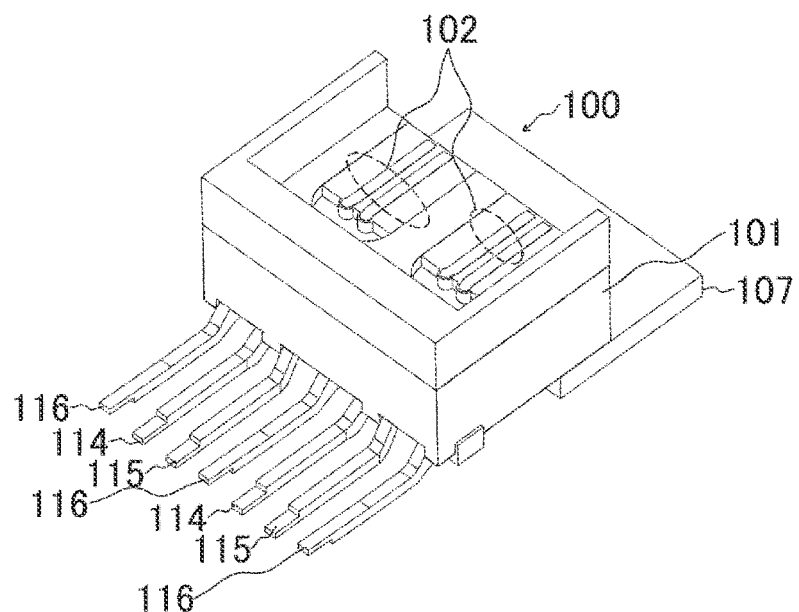
FIG. 2D is a perspective view showing the state of the high-frequency package in a middle step so as to explain the manufacturing method for the high-frequency package according to the second embodiment of the present invention.

When the package main body 100 is mounted on the upper surface of the base portion 131a, as described above, the package main body 100 is slid in the slide direction (FIG. 2C). By this slide, the interval between the first lead 114 and the second lead 115 gradually changes (decreases). When the cut ends of the leads are moved up to the center of the plurality of projections 131c, and the lead shape changing jig 131 is detached after that, the interval between the linear portion of the first lead 114 and the linear portion of the second lead 115 becomes equal over the whole area (the pitches become even), as shown in FIG. 2D.

After that, the lengths of the first lead 114, the second lead 115, and the third leads 116 are aligned, as in the above-described first embodiment (seventh step). When completed, a high-frequency package in which the pitches between the third leads 116 serving as ground lead pins and the first lead 114 and the second lead 115 serving as signal lead pins are aligned can be obtained. As the characteristic feature of the second embodiment, the pitches of the differential signal lead pins are corrected using a slide-type lead shape changing jig.

By the manufacturing method according to the above-described second embodiment, even if the pitches of the differential signal lines in the package main body are narrow, the pitch width of the differential signal lead pins can be made wider than that. This can align the pitches of all lead pins and make contribution to improvement of productivity when mounting the package on a board.

Third Embodiment

A manufacturing method for a high-frequency package according to the third embodiment of the present invention will be described next with reference to FIGS. 3A to 3C.

First, as is the first embodiment, as described with reference to FIGS. 1A and 1B, a package main body 100 is prepared (first step). Next, as described with reference to FIGS. 1C, 1D, and 1E, a first lead frame no is prepared (second step), and a second lead frame 112 is prepared (third step).

Next, as described with reference to FIGS. 1F and 1G, a distal end portion 114b of a first lead 114 of the first lead frame no is connected to a first signal pad 104, a distal end portion 115b of a second lead 115 is connected to a second signal pad 105, and a distal end portion 116b of a third lead 116 of the second lead frame 112 is connected to a ground pad 106 (fourth step).

After the above-described fourth step, the first frame 111 is separated from the first lead 114 and the second lead 115, and the second frame 113 is separated from the third leads 116 by the same method as in the above-described first embodiment (fifth step).

Next, after the fifth step, the interval between the linear portion of the first lead 114 and the linear portion of the second lead 115 is adjusted (sixth step). First, as shown in FIG. 3A, a rotation-type lead shape changing jig 141 is prepared. In the third embodiment, for the package main body 100, the lead shape changing jig 141 having a columnar shape is rotated about its axis, thereby sliding the package main body 100 relatively in the rotation direction on the outer peripheral surface of the lead shape changing jig 141 and adjusting the interval between the linear portion of the first lead 114 and the linear portion of the second lead 115.

The lead shape changing jig 141 includes a main body 141a having a columnar shape, and a plurality of grooves 141b formed in the outer peripheral surface of the main body 141a. The plurality of grooves 141b extend in the circumferential direction, and the groove width is the same as the width of each lead. In addition, the interval between the adjacent grooves 141b equals the interval to arrange the bent portions of the leads.

Figure 3A:
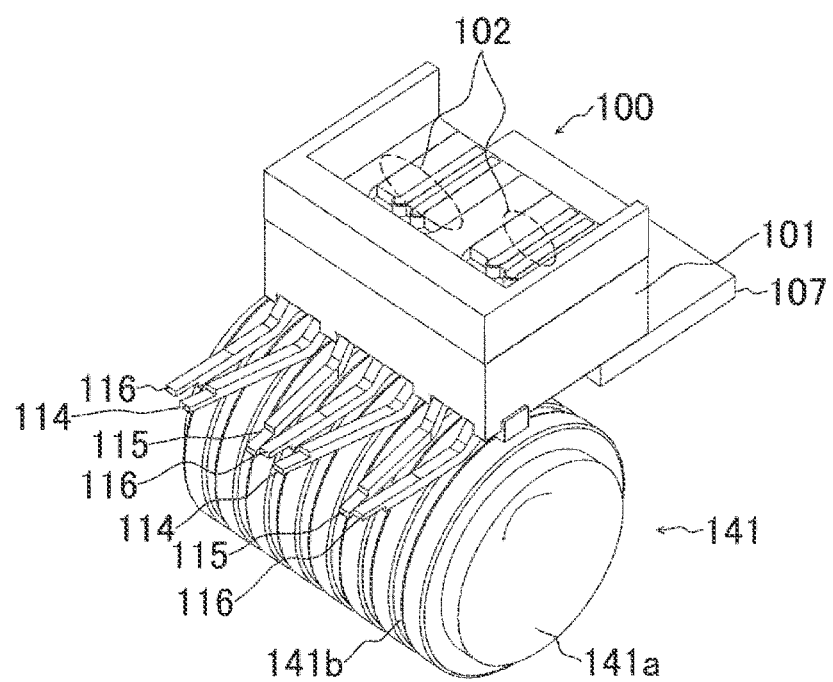
FIG. 3A is a perspective view showing the state of a high-frequency package in a middle step so as to explain a manufacturing method for a high-frequency package according to the third embodiment of the present invention.
Figure 3B:
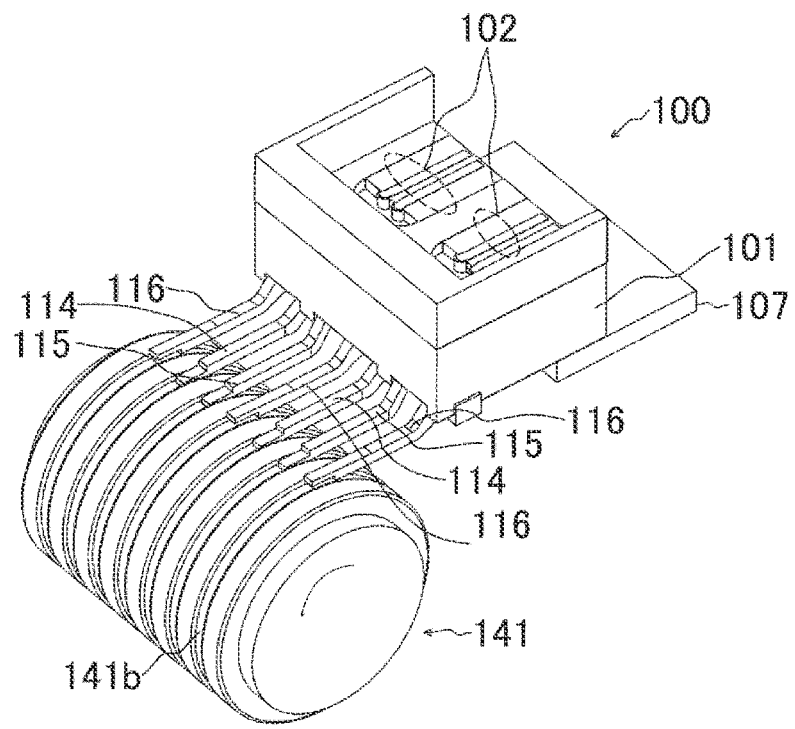
FIG. 3B is a perspective view showing the state of the high-frequency package in a middle step so as to explain the manufacturing method for the high-frequency package according to the third embodiment of the present invention.
Figure 3C:
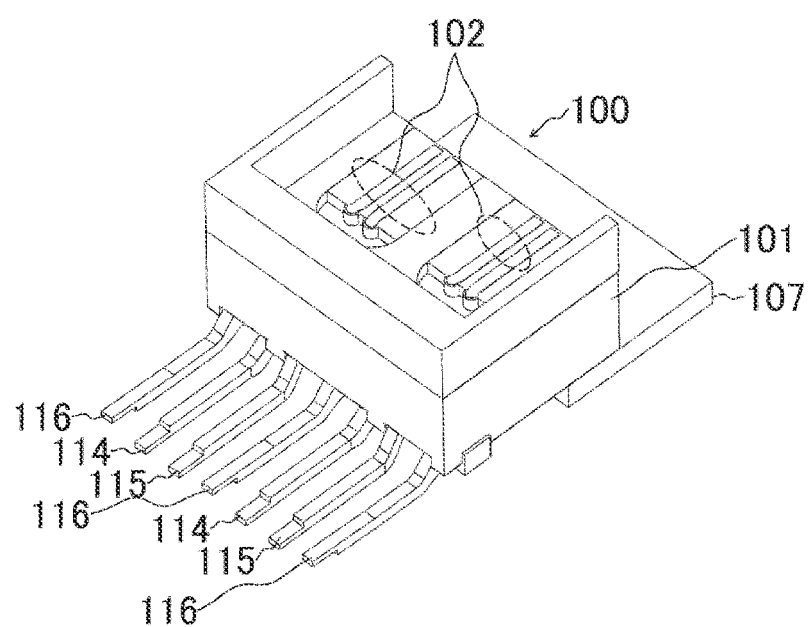
FIG. 3C is a perspective view showing the state of the high-frequency package in a middle step so as to explain the manufacturing method for the high-frequency package according to the third embodiment of the present invention.

First, as shown in FIG. 3A, the package main body 100 is mounted on the peripheral surface of the lead shape changing jig 141, in which the plurality of grooves 141b are formed. At this time, the array direction of the pads provided on the mounting surface of a substrate 101 is set vertical to the circumferential direction (slide direction) of the peripheral surface. In addition, the bent portion of each lead is fitted in a corresponding one of the grooves 141b.

When the package main body 100 is mounted, on the upper surface of the base portion 131a, on the peripheral surface of the lead shape changing jig 141, as described above, the lead shape changing jig 141 (main body 141a) is rotated about the axis. By this rotation, the portions of the leads, which are fitted in the grooves 141b, are moved from the bent portions of the leads in the direction of the cut ends. When the fitted portions move along with the rotation, the interval between the first lead 114 and the second lead 115 gradually changes (decreases). As shown in FIG. 3B, when the cut end of each lead is fitted in a corresponding one of the grooves 141b, and the lead shape changing jig 141 is detached after that, the interval between the linear portion of the first lead 114 and the linear portion of the second lead 115 becomes equal over the whole area (the pitches become even), as shown in FIG. 3C.

After that, the lengths of the first lead 114, the second lead 115, and the third leads 116 are aligned, as in the above-described first embodiment (seventh step). When completed, a high-frequency package in which the pitches between the third leads 116 serving as ground lead pins and the first lead 114 and the second lead 115 serving as signal lead pins are aligned can be obtained. As the characteristic feature of the third embodiment, the pitches of the differential signal lead pins are corrected using a slide-type lead shape changing jig.

By the manufacturing method according to the above-described third embodiment, even if the pitches of the differential signal lines in the package main body are narrow, the pitch width of the differential signal lead pins can be made wider than that. This can align the pitches of all lead pins and make contribution to improvement of productivity when mounting the package on a board.

Fourth Embodiment

A manufacturing method for a high-frequency package according to the fourth embodiment of the present invention will be described next with reference to FIGS. 4A to 4K.

Figure 4A:
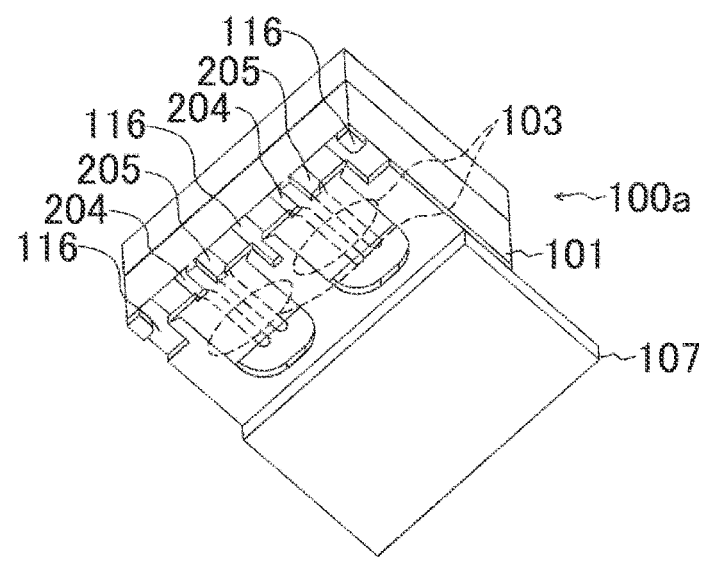
FIG. 4A is a perspective view showing the state of a high-frequency package in a middle step so as to explain a manufacturing method for a high-frequency package according to the fourth embodiment of the present invention.

First, as shown in FIG. 4A, a package main body 100a is prepared (first step). The package main body 100a includes a substrate 101 made of an insulator, a first differential coplanar line 102 formed on the surface of the substrate 101, and a second differential coplanar line 103 formed on the back surface on the side of the mounting surface of the substrate 101 and connected to the first differential coplanar line 102. Note that FIG. 1B shows the side of the mounting surface of the package main body 100a (substrate 101). Also, a spacer 107 configured to make the distance constant between a part of the package main body 100 and a mounting board on which these are mounted is provided on the package main body 100a (substrate 101).

Also, the package main body 100a includes a first signal pad 204, a second signal pad 205, and two ground pads 106. The first signal pad 204 is arranged on the side of the back surface (mounting surface) of the substrate 101 and connected to the first signal line of the second differential coplanar line 103. The second signal pad 205 is arranged on the side of the back surface of the substrate 101 and connected to the second signal line of the second differential coplanar line 103. The first signal pad 204 and the second signal pad 205 have the same interval from the center side of the package main body 100a toward an end side. The two ground pads 106 are arranged on the side of the back surface of the substrate 101 and connected to the two ground lines of the second differential coplanar line 103.

Figure 4B:
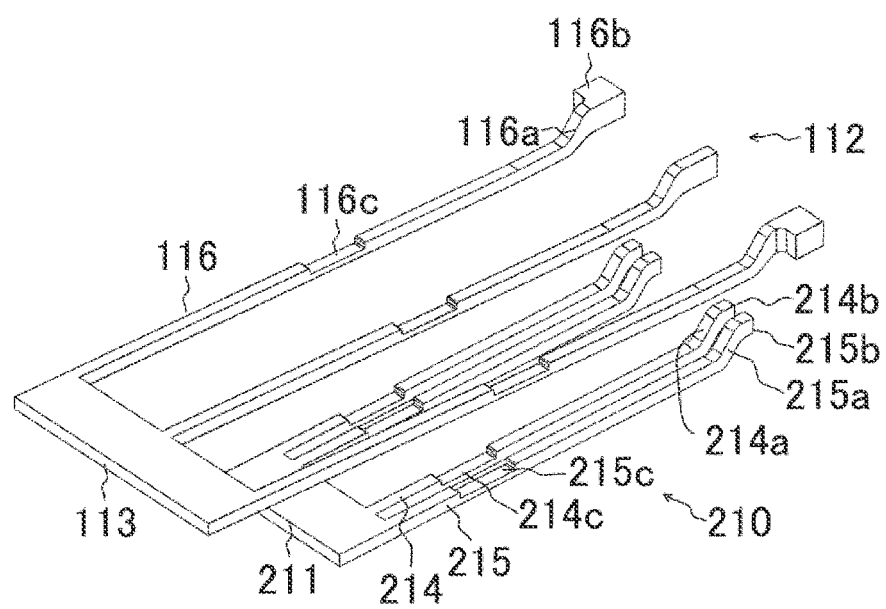
FIG. 4B is a perspective view showing the state of the high-frequency package in a middle step so as to explain the manufacturing method for the high-frequency package according to the fourth embodiment of the present invention.
Figure 4C:
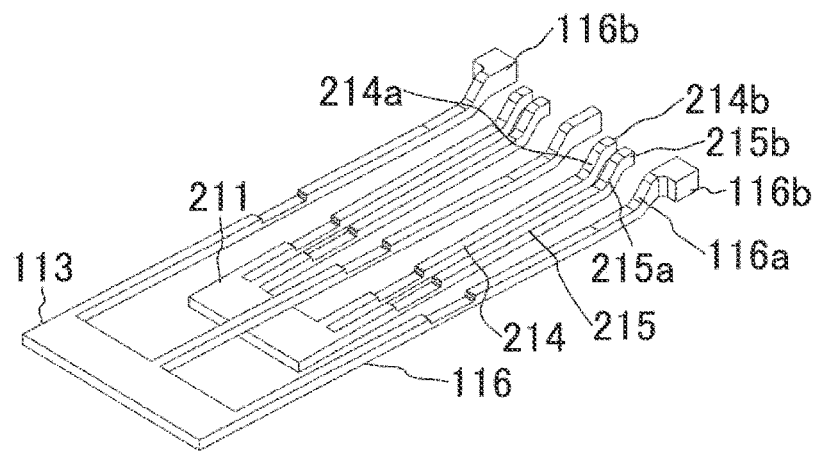
FIG. 4C is a perspective view showing the state of the high-frequency package in a middle step so as to explain the manufacturing method for the high-frequency package according to the fourth embodiment of the present invention.

Next, as shown in FIGS. 4B and 4C, a first lead frame 210 is prepared (second step), and a second lead frame 112 is prepared (third step). The second lead frame 112 is the same as in the above-described first embodiment, and a detailed description thereof will be omitted.

The first lead frame 210 includes a plate-shaped first frame 211, a first lead 214, and a second lead 215. The first lead 214 and the second lead 215 respectively include linear portions extending on a plane including the plane of the first frame 211, bent portions 214a and 215a bent in a direction for separating from the plane including the plane of the first frame 211, and distal end portions 214b and 215b at the tips of the bent portions 214a and 215a. Also, the interval between the distal end portion 214b of the first lead 214 and the distal end portion 215b of the second lead 215 is the interval between the first signal pad 204 and the second signal pad 205. Note that the interval between the first signal pad 204 and the second signal pad 205 is narrower than the interval between the first signal pad 204 and the ground pad 106, which are adjacent to each other, and the interval between the second signal pad 205 and the ground pad 106, which are adjacent to each other.

Additionally, in the fourth embodiment, the first lead frame 210 has a shape in which the interval between the first lead 214 and the second lead 215 is the same interval from the side of the distal end portions 214b and 215b to the side of the first frame 211. Also, in the first lead 214 and the second lead 215, thin portions 214c and 215c having a small thickness are provided in the middle of the linear portions to facilitate a cutting work to be performed in post-processing.

The first lead frame 210 and the second lead frame 112 are arranged at a predetermined position and overlaid. Note that in the fourth embodiment as well, in a region of the linear portion of a predetermined length from the bent portion, the positions of the bottom surfaces of the leads are made to match. This region can be used as a reference plane in post-processing.

Figure 4D:
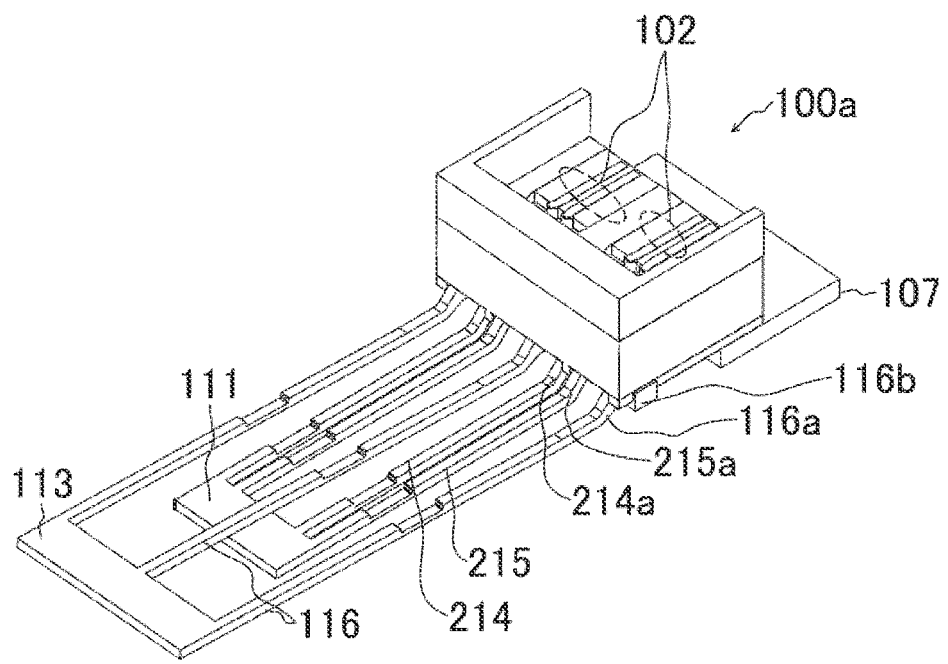
FIG. 4D is a perspective view showing the state of the high-frequency package in a middle step so as to explain the manufacturing method for the high-frequency package according to the fourth embodiment of the present invention.

Next, the distal end portion 214b of the first lead 214 of the first lead frame 210 is connected to the first signal pad 204, the distal end portion 215b of the second lead 215 is connected to the second signal pad 205, and the distal end portion 116b of the third lead 116 of the second lead frame 112 is connected to the ground pad 106 (fourth step). For example, the above-described connection can be done by soldering using silver solder or the like. FIG. 4D shows a state in which the lead frames are connected.

Figure 4E:
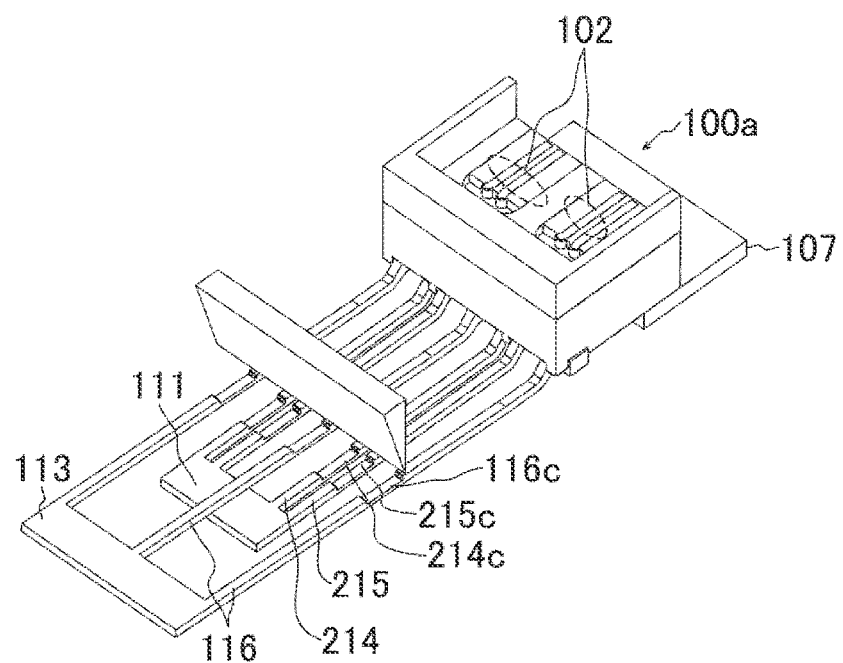
FIG. 4E is a perspective view showing the state of the high-frequency package in a middle step so as to explain the manufacturing method for the high-frequency package according to the fourth embodiment of the present invention.

After the above-described fourth step, the first frame 211 is separated from the first lead 214 and the second lead 215, and the second frame 113 is separated from the third leads 116 (fifth step). For example, as shown in FIG. 4E, the thin portions with a small thickness in the middle of the linear portions of the leads are cut at once using a cutting blade 118 to make each lead have a predetermined length. After the cutting, in the fourth embodiment, the finish shape of the first lead 214 and the second lead 215 and the finish shape of the third leads 116 are the same.

Figure 4F:
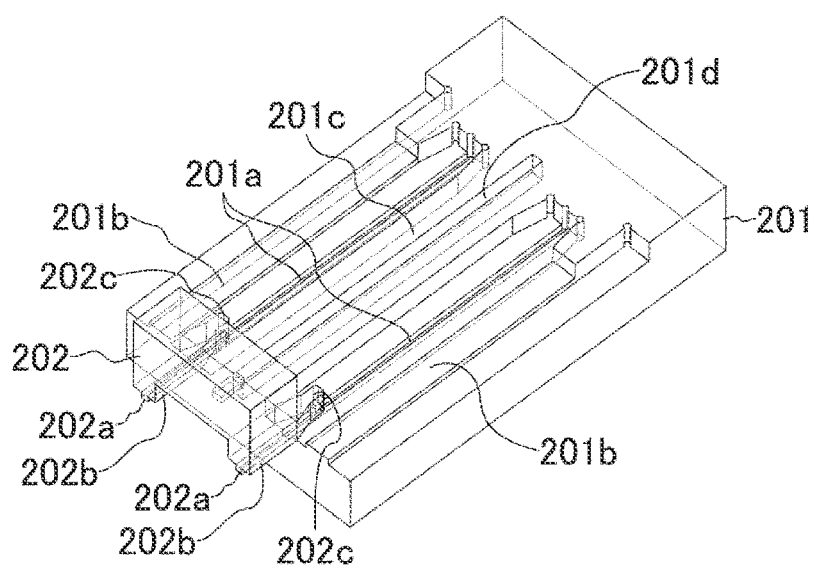
FIG. 4F is a perspective view showing the state of the high-frequency package in a middle step so as to explain the manufacturing method for the high-frequency package according to the fourth embodiment of the present invention.

Next, after the fifth step, the interval between the linear portion of the first lead 214 and the linear portion of the second lead 215 is adjusted (sixth step). In this adjustment, a base jig 201 and a correction jig 202 shown in FIG. 4F are used. The base jig 201 includes a guide groove 201a configured to slide the correction jig 202, and a first guiderail 201b and a second guiderail 201C, which are formed across the region where the guide groove 201a is formed. In addition, the second guiderail 201C is provided with a groove 201d in which the third lead 116 is fitted.

On the other hand, the correction jig 202 includes a slide projection 202a fitted in the guide groove 201a, and a convex portion 202b configured to increase the interval between the first lead 214 and the second lead 215. The width of the convex portion 202b decreases toward the side of a distal end 202C.

Figure 4G:
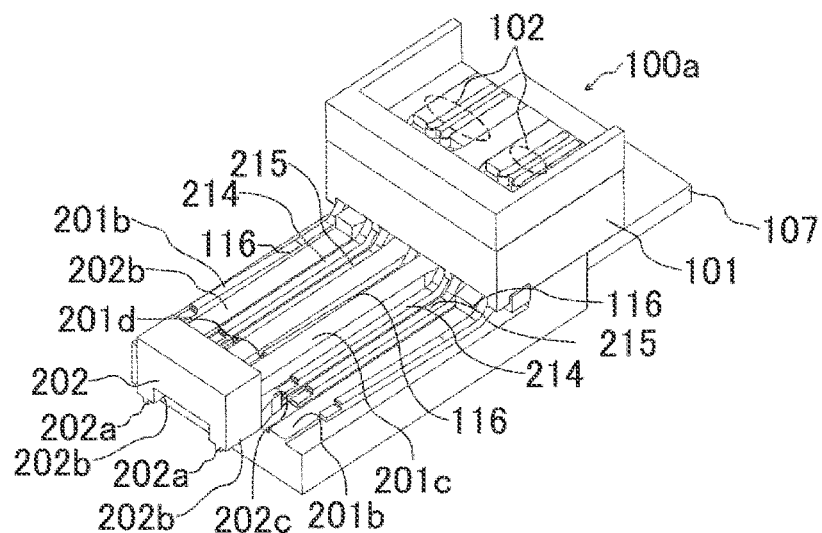
FIG. 4G is a perspective view showing the state of the high-frequency package in a middle step so as to explain the manufacturing method for the high-frequency package according to the fourth embodiment of the present invention.

First, as shown in FIG. 4G, the base jig 201 is arranged on the side of the mounting surface of the package main body 100a, and the first lead 214 and the second lead 215 are arranged between the first guiderail 201b and the second guiderail 201C. In addition, the first lead 214 and the third lead 116 on the outer side are arranged across the first guiderail 201b. The third lead 116 at the center is fitted in the groove 201d.

Figure 4H:
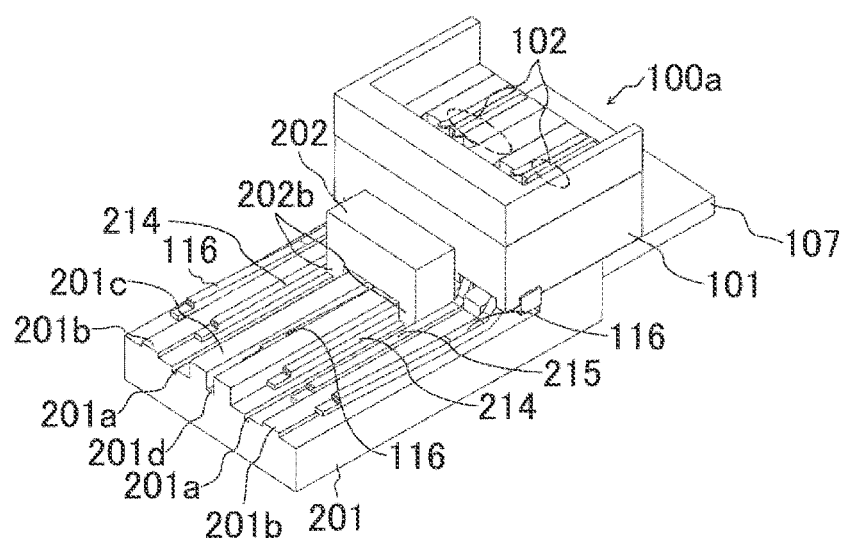
FIG. 4H is a perspective view showing the state of the high-frequency package in a middle step so as to explain the manufacturing method for the high-frequency package according to the fourth embodiment of the present invention.

Next, the slide projection 202a of the correction jig 202 is fitted in the guide groove 201a. Also, between the first guiderail 201b and the second guiderail 201C, the distal end 202C of the convex portion 202b is inserted between the first lead 214 and the second lead 215. In this state, the state in which the slide projection 202a is fitted in the guide groove 201a is maintained, and the correction jig 202 is slid from the cut end side of the leads to the side of the bent portions (FIG. 4H).

By the slide of the above-described correction jig 202, the convex portion 202b inserted between the first lead 214 and the second lead 215 increases (adjusts) the interval between the first lead 214 and the second lead 215. When the slid correction jig 202 reaches the package main body 100a, the interval between the linear portion of the first lead 214 and the linear portion of the second lead 215 is increased over the whole area, and the intervals between the leads become equal (the pitches become even).

Figure 4I:
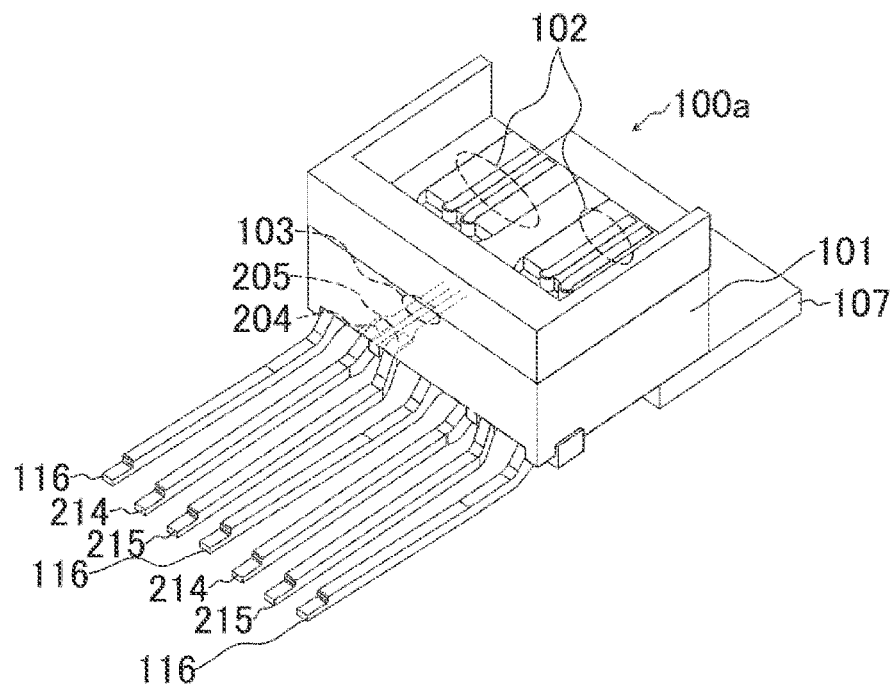
FIG. 4I is a perspective view showing the state of the high-frequency package in a middle step so as to explain the manufacturing method for the high-frequency package according to the fourth embodiment of the present invention.

In the fourth embodiment, when the intervals between the leads are made equal by the above-described processing, the interval between the linear portions of the first lead 214 and the second lead 215 becomes wider than the interval between the first signal pad 204 and the second signal pad 205 (FIG. 4I).

Figure 4J:
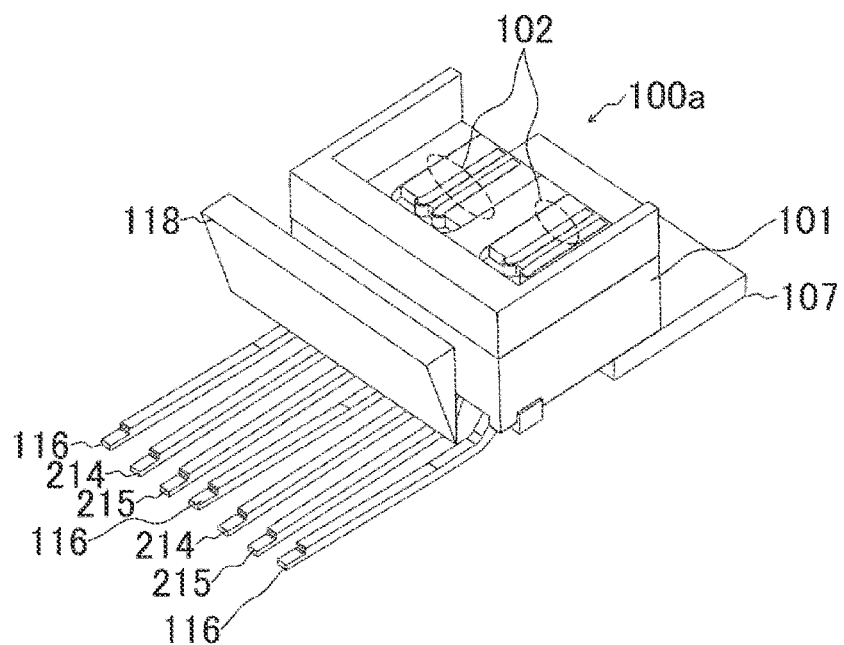
FIG. 4J is a perspective view showing the state of the high-frequency package in a middle step so as to explain the manufacturing method for the high-frequency package according to the fourth embodiment of the present invention.
Figure 4K:
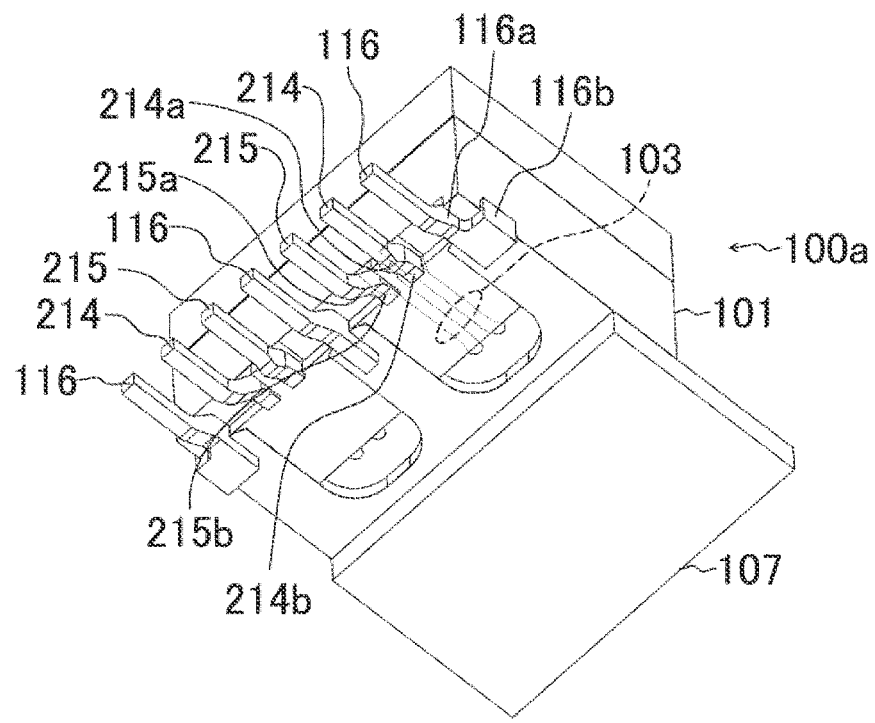
FIG. 4K is a perspective view showing the state of the high-frequency package in a middle step so as to explain the manufacturing method for the high-frequency package according to the fourth embodiment of the present invention.
Figure 5:
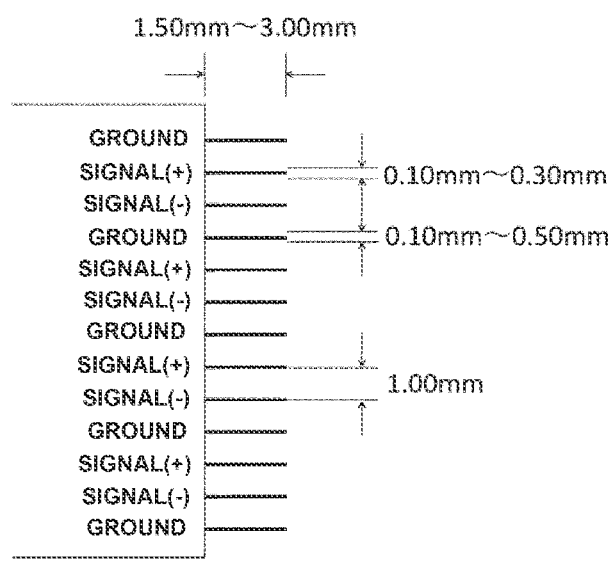
FIG. 5 is an explanatory view showing the configuration of a conventional high-frequency package.
Figure 6:
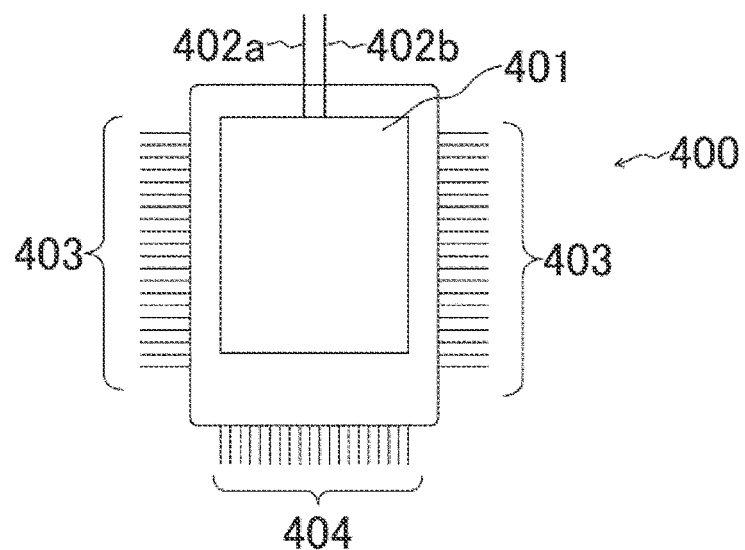
FIG. 6 is a view showing the configuration of a conventional optical reception module.
Figure 7:
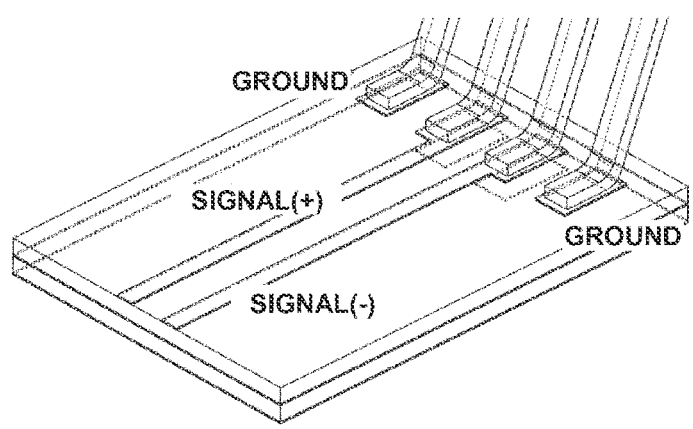
FIG. 7 is a perspective view showing the configuration of a part of the conventional high-frequency package.

Next, the lengths of the first lead 214, the second lead 215, and the third leads 116 are aligned (seventh step). For example, as shown in FIG. 4J, the leads are cut at once using the cutting blade 118, thereby aligning the lengths of the first lead 214, the second lead 215, and the third leads 116, as shown in FIG. 4K.

When completed, a high-frequency package in which the pitches between the third leads 116 serving as ground lead pins and the first lead 214 and the second lead 215 serving as signal lead pins are aligned can be obtained. By the manufacturing method according to the above-described fourth embodiment, even if the pitches of the differential signal lines in the package main body are narrow, the pitch width of the differential signal lead pins can be made wider than that. This can align the pitches of all lead pins and make contribution to improvement of productivity when mounting the package on a board.

As described above, according to embodiments of the present invention, after the distal end portion of the first lead of the first lead frame is connected to the first signal pad, and the distal end portion of the second lead is connected to the second signal pad, the interval between the linear portion of the first lead and the linear portion of the second lead is adjusted. It is therefore possible to provide an efficient manufacturing method for a high-frequency package, which changes the interval between lead pins.

Note that the present invention is not limited to the above-described embodiments, and it is obvious that many modifications and combinations can be made by a person skilled in the art in this field within the technical scope of the present invention.

EXPLANATION OF THE REFERENCE NUMERALS AND SIGNS

100 . . . package main body, 101 . . . substrate, 102 . . . first differential coplanar line, 103 . . . second differential coplanar line, 104 . . . first signal pad, 105 . . . second signal pad, 106 . . . ground pad, 107 . . . spacer, 110 . . . first lead frame, 111 . . . first frame, 113 . . . second frame, 114 . . . first lead, 114a . . . bent portion, 114b . . . distal end portion, 114c . . . thin portion, 115 . . . second lead, 115a . . . bent portion, 115b . . . distal end portion, 115c . . . thin portion, 116 . . . third lead, 116a . . . bent portion, 116b . . . distal end portion, 116c . . . thin portion, 117 . . . region, 118 . . . cutting blade, 121 . . . holding jig, 122 . . . lead shape changing jig, 122a . . . base portion, 122b . . . projecting portion, 122c . . . projecting portion, 123 . . . pressing jig.

The invention claimed is:

1. A manufacturing method for a high-frequency package, comprising:
a first step of preparing a package main body including:
a substrate comprising alternately laminated insulator layers and conductor layers,
a first differential coplanar line on a first surface of the substrate,
a second differential coplanar line on a second surface of the substrate, the second surface of the substrate is on a side of a mounting surface of the substrate, the second differential coplanar line being connected to the first differential coplanar line,
a first signal pad arranged on a side of the second surface of the substrate and connected to a first signal line of the second differential coplanar line,
a second signal pad arranged on the side of the second surface of the substrate and connected to a second signal line of the second differential coplanar line, and
two ground pads arranged on the side of the second surface of the substrate and connected to two ground lines of the second differential coplanar line;
a second step of preparing a first lead frame comprising a plate-shaped first frame, a first lead, and a second lead, each of the first lead and the second lead including a linear portion extending on a plane including a plane of the first lead frame, a bent portion bent in a direction for separating from the plane including the plane of the first frame, and a distal end portion at a tip of the bent portion, in which an interval between the distal end portion of the first lead and the distal end portion of the second lead is an interval between the first signal pad and the second signal pad;
a third step of preparing a second lead frame including a second frame and two third leads, each of the two third leads including a linear portion extending on a plane including a plane of the second frame, a bent portion bent in a direction for separating from the plane including the plane of the second frame, and a distal end portion at a tip of the bent portion, in which an interval between the distal end portions of the two third leads is an interval between the two ground pads;
a fourth step of connecting the distal end portion of the first lead of the first lead frame to the first signal pad, connecting the distal end portion of the second lead to the second signal pad, and connecting the distal end portions of the two third leads of the second lead frame to the two ground pads;
a fifth step of, after the fourth step, separating the first frame from the first lead and the second lead, and separating the second frame from the two third leads;
a sixth step of, after the fifth step, adjusting an interval between the linear portion of the first lead and the linear portion of the second lead; and
a seventh step of, after the sixth step, aligning lengths of the first lead, the second lead, and the two third leads.

2. The manufacturing method for the high-frequency package according to claim 1, wherein:
the first lead frame has a shape in which the interval between the first lead and the second lead becomes wider from a side of the distal end portions of the first and second leads to a side of the first frame, and
the second lead frame has a shape in which the interval between the two third leads is the same interval from a side of the distal end portions of the two third leads to a side of the second frame.

3. The manufacturing method for the high-frequency package according to claim 2, wherein:
in the sixth step, the interval between the linear portion of the first lead and the linear portion of the second lead is decreased to equalize the intervals between the linear portion of the first lead, the linear portion of the second lead, and the linear portions of the two third leads.

4. The manufacturing method for the high-frequency package according to claim 1, wherein:
the first lead frame has a shape in which the interval between the first lead and the second lead is the same interval from a side of the distal end portions of the first lead and the second lead to a side of the first frame, and
the second lead frame has a shape in which the interval between the two third leads is the same interval from a side of the distal end portions of the two third leads to a side of the second frame.

5. The manufacturing method for the high-frequency package according to claim 4, wherein:
in the sixth step, the interval between the linear portion of the first lead and the linear portion of the second lead is increased to equalize the intervals between the linear portion of the first lead, the linear portion of the second lead, and the linear portion of the third lead.

6. The manufacturing method for the high-frequency package according to claim 1, wherein:
the interval between the first signal pad and the second signal pad is narrower than an interval between the first signal pad and a ground pad, adjacent to the first signal pad, of the two ground pads and an interval between the second signal pad and a ground pad, adjacent to the second signal pad, of the two ground pads.

* * * * *